(12) United States Patent
Wagenleitner

(10) Patent No.: US 9,464,884 B2
(45) Date of Patent: Oct. 11, 2016

(54) METHOD FOR DETERMINING THE POSITION OF A ROTATION AXIS

(75) Inventor: Thomas Wagenleitner, Aurolzmünster (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 671 days.

(21) Appl. No.: 13/878,245

(22) PCT Filed: Oct. 26, 2010

(86) PCT No.: PCT/EP2010/006517
§ 371 (c)(1),
(2), (4) Date: Apr. 8, 2013

(87) PCT Pub. No.: WO2012/065615
PCT Pub. Date: May 24, 2012

(65) Prior Publication Data
US 2013/0211779 A1    Aug. 15, 2013

(51) Int. Cl.
*G01B 11/00*  (2006.01)
*H01L 21/67*  (2006.01)
*H01L 21/68*  (2006.01)

(52) U.S. Cl.
CPC ....... *G01B 11/002* (2013.01); *H01L 21/67259* (2013.01); *H01L 21/681* (2013.01)

(58) Field of Classification Search
CPC .................................................. G01B 11/002
See application file for complete search history.

(56) References Cited

U.S. PATENT DOCUMENTS 7,567,699 B2 * 7/2009 Hansen ................ G01B 11/272
356/509

(Continued)

FOREIGN PATENT DOCUMENTS

| EP | 1564804 A1 | 8/2005 | ............. H01L 21/68 |
| EP | 1886771 A1 | 2/2008 | ................ B25J 9/10 |

(Continued)

OTHER PUBLICATIONS

Office Action received in corresponding Japanese Patent Application No. 2013-535282, dated Jun. 30, 2014 (English-language translation included).
Int'l Search Report from corresponding PCT/EP2010/006517 (Form PCT/ISA/210); 3 pages.

*Primary Examiner* — John Breene
*Assistant Examiner* — Jeffrey C Morgan
(74) *Attorney, Agent, or Firm* — Kusner & Jaffe

(57) ABSTRACT

In a system having a substrate holding means for holding a substrate, wherein the substrate holding means is rotatable about an axis of rotation that is perpendicular to an X-Y coordinate system, a method for determining position of the axis of rotation in the X-Y coordinate system, comprising the steps of:
  providing a reference labeling on the substrate holding means or on the substrate;
  determining a first X-Y reference position RP of a reference labeling on the substrate holding means or on the substrate by means of optical positional detecting means that is fixed relative to the X-Y coordinate system,
  rotating the substrate holding means by a defined angle of rotation R around the axis of rotation,
  determining by means of said fixed optical positional detecting means a second X-Y reference position RP' of the reference labeling that is changed by the rotation, and
  calculating the X-Y position of the axis of rotation in the substrate.

5 Claims, 5 Drawing Sheets

(56) References Cited

U.S. PATENT DOCUMENTS

| | | | |
|---|---|---|---|
| 2005/0016818 A1 | 1/2005 | Ito et al. | 198/345.1 |
| 2006/0023214 A1 | 2/2006 | Lof et al. | 356/401 |
| 2007/0020871 A1 | 1/2007 | Chen et al. | 438/401 |

FOREIGN PATENT DOCUMENTS

| | | | | |
|---|---|---|---|---|
| JP | 2003318249 A | 11/2003 | | H01L 21/68 |
| JP | 2005-019963 A | 1/2005 | | B65D 49/07 |
| JP | 2009-276313 A | 11/2009 | | G01B 11/00 |

\* cited by examiner

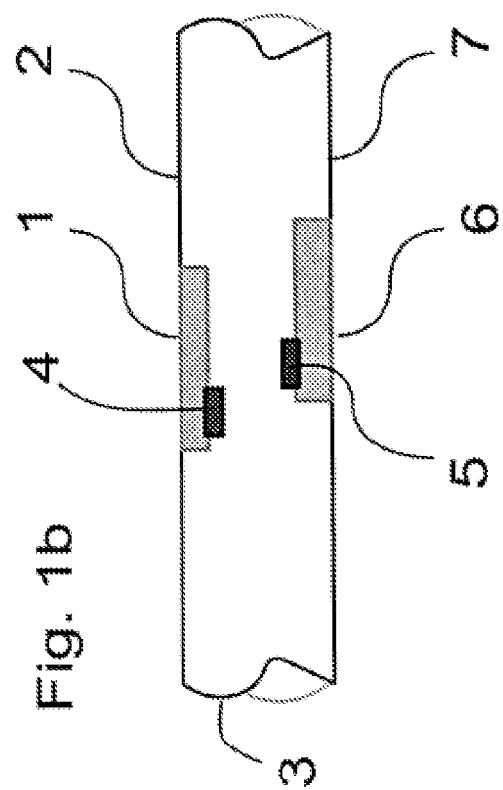
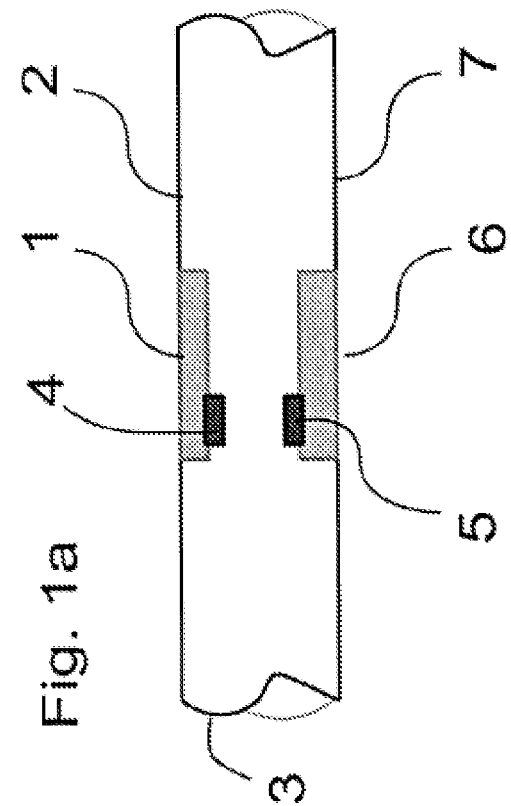

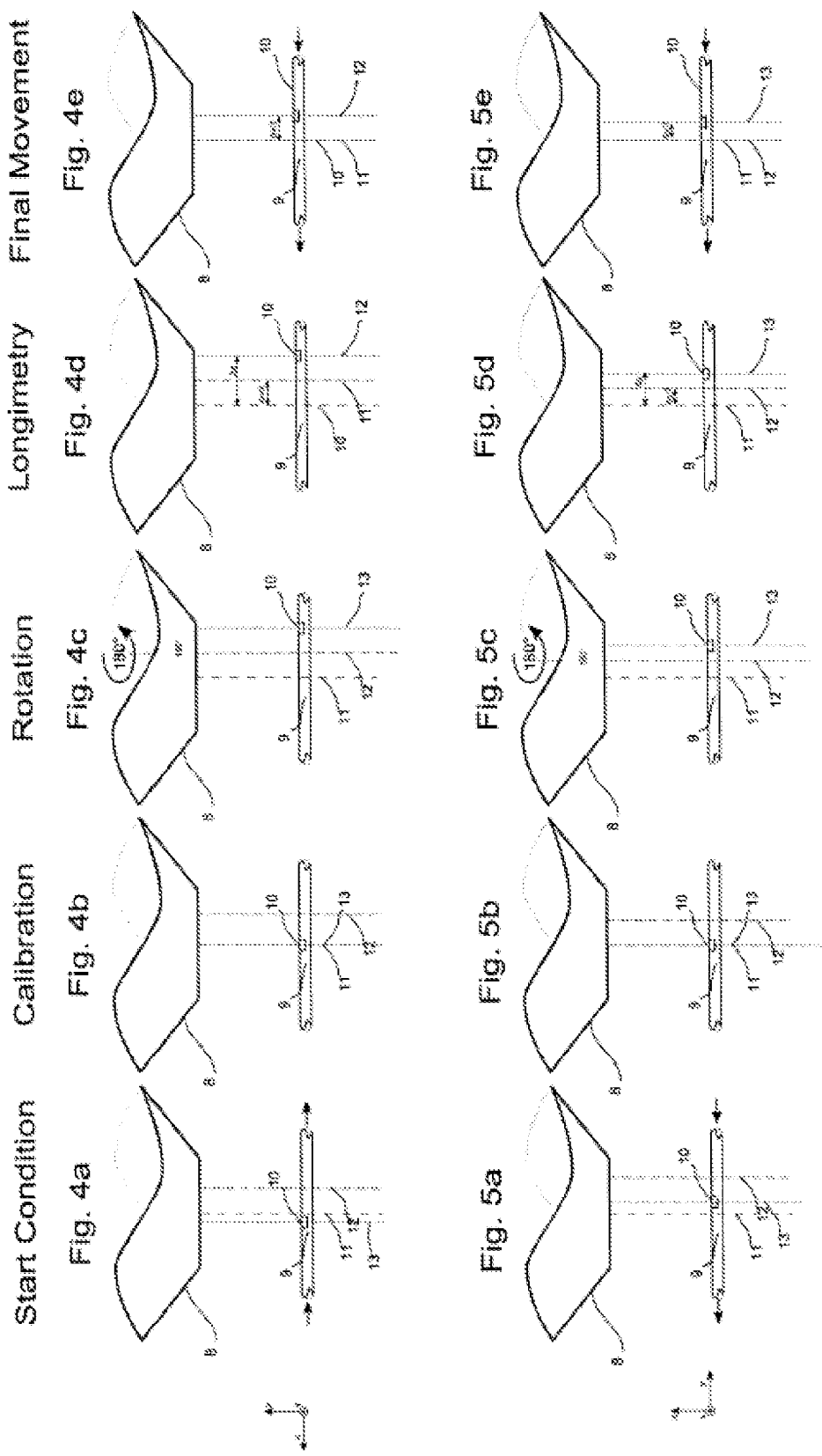

METHOD FOR DETERMINING THE POSITION OF A ROTATION AXIS

FIELD OF THE INVENTION

The invention relates to a method for determining an X-Y position in an X-Y coordinate system of an axis of rotation that is perpendicular to the X-Y coordinate system of a substrate holding means that can rotate around the axis of rotation for holding a substrate, and a method for determining a position of an axis of rotation R of the substrate in the substrate plane that is perpendicular to a substrate plane of a substrate. The invention further relates to a method for determining a position of an axis of rotation of the substrate holding means that is perpendicular to a substrate holding means plane of a substrate holding means for holding a substrate. The substrates of the present invention include semiconductors, preferably wafers, glass, quartz, ceramic and metal, and the application of a method to determine an orientation error of a large number of contact points oriented to one another and arranged on two opposite sides of a substrate.

BACKGROUND OF THE INVENTION

Because of ever greater miniaturization of semiconductor components, such components will increasingly be built in stacked form in the future. Accordingly, a need exists for an optimized method for production of such stacked semiconductor products. A method to stack semiconductor components vertically consists in, i.a., outfitting a wafer on both sides with semiconductor elements, in particular dices and/or chips on both sides. On both sides of the wafer, there is therefore a large number of semiconductor components, which are connected via contact points in further process steps to corresponding wafers that are outfitted in each case on both sides with semiconductor components. Because of the ever smaller components, in particular dices and/or chips, it is of decisive importance that the corresponding contact points of the semiconductor components align with one another as precisely as possible, thus are oriented vertically to one another. In the case of an inaccurate orientation or movement of the semiconductor components, in particular the contact points of the semiconductor components on the opposite sides of the wafer, the corresponding contacts would not—or not adequately—be connected to one another. For this reason, a check of the position of the contact points on the top and bottom of each wafer takes place.

Since a large number of contact points on each wafer are to be examined, and in particular, the orientation of each contact point with the respective opposite contact point is relevant, this check is time-consuming and accordingly costly.

To determine the orientation errors of opposite contact points, it has proven to be effective to detect the position of each contact point on each substrate side in a first rotational position of the substrate and in a second rotational position that is rotated by 180 degrees relative to the first rotational position. The rotation by 180 degrees (that is performed in this case) has the effect that measuring inaccuracies introduced by the optical positional detection means are almost canceled out, and filtered from the measuring result. In this respect, a technical problem exists. After rotation of the substrate, first the new position with the lens to be used as a detection means has to be approached approximately (so-called pre-alignment).

SUMMARY OF THE INVENTION

The object is therefore to develop a method with which the above-mentioned technical problems can be solved so that a faster, and accordingly more economical, determination of the righting error of the contact points to be oriented to one another in each case can be enabled.

This object is achieved with the features of the claims. Advantageous further developments of the invention are indicated in the subclaims. All combinations of at least two features indicated in the description, the claims and/or the figures also fall within the scope of the invention. In the case of indicated value ranges, values that are within the above-mentioned limits are also to be disclosed as boundary values and can be claimed in any combination.

The present invention is based on the idea of selecting a new approach whereby, before the orientation errors of the contact points of the substrate are determined, the substrate's axis of rotation, or the axis of rotation of a substrate holding means for holding the substrate, is determined in order to be able to deduce the opposite position of the contact point for the measurement in the second rotational position in each case by means of the unchanging exact position of the axis of rotation of the substrate or the substrate holding means holding the substrate.

Thus, the time-consuming pre-alignment at each contact point is eliminated according to the invention, by which a determination of the orientation error of the contact points oriented to one another in each case is accelerated many times. In this respect, it is especially advantageous that the rotation of each substrate has to take place only once if the X-Y positions of the contact positions are first detected in a first rotational position of the substrate/the substrate holding means, and then, i.e., after one-time rotation of the substrate by the substrate holding means, the corresponding X-Y positions of the contact points are detected in a second rotational position.

With the previously necessary pre-alignment, first the corresponding contact point to be measured had to be brought after rotation from one side again into the detection area of the optical detection means and thereby centered before the position of the corresponding contact point of the opposite side could be determined on the opposite side of the substrate.

According to the invention, the pre-alignment is replaced by a calculation of the position of the contact point after the rotation based on the known position of the axis of rotation. As reference labeling for determining the position of the axis of rotation, an optically detectable labeling especially provided for this purpose on the substrate or on the substrate holding means can be provided, or a structure that is present on the substrate, in particular a contact point, can be used.

According to an advantageous embodiment of the invention, it is provided that the rotation of the substrate around the axis of rotation is carried out with a specified angle of rotation R by a substrate holding means, whereby the substrate holding means is designed to support the substrate, in particular on its periphery, preferably in the form of a ring, so that the contact points on the bottom of the substrate remain accessible from below through the ring opening. Especially advantageous, and for the most exact possible determination of the position of the axis of rotation, the reference labeling is arranged on or in the ring of the substrate holding means. This is especially desirable because the substrate is fixed to the substrate holding means during the determination of the X-Y position of the axis of rotation as well as during the determination of the orientation error of a large number of opposite contact points. Thus, the X-Y position of the reference labeling in each new substrate is already known in advance, and only the X-Y position of the axis of rotation is to be determined, without having to search for the position of the reference labeling on the substrate.

According to another advantageous embodiment of the invention, there is provided a method as described above where the determination of the first and second reference positions is carried out by optical positional detecting means, in particular comprising a lens, preferably with an optical axis parallel to the axis of rotation R. In particular in the case of a digital configuration of the optical positional detection means, the detection can be carried out digitally, so that the position of the axis of rotation R is calculated in electronic form by a corresponding data processing system.

If the substrate holding means can be moved relative to the optical positional detection means along the X-Y coordinate system, and the relative movement can be detected in the X-direction and Y-direction spanned into the X-Y coordinate system, the calculation of the positions of the reference labeling and corresponding to the axis of rotation, in particular when using a Cartesian coordinate system, is greatly simplified.

Thus, in the further development and use of the above-described method, a method for determining an orientation error of a large number of contact points, oriented to one another and arranged on two opposite sides of a substrate, can be implemented according to the invention, the method comprising the steps of:

applying a substrate on a substrate holding means that can move along an X-Y coordinate system and that can rotate around an axis of rotation that is perpendicular to an X-Y coordinate system, determining the position of the axis of rotation with the above-described steps before or after applying the substrate to the substrate holding means, and determining the orientation error of the contact points that are oriented to one another in each case.

In accordance with the present invention, it is especially advantageous if the determination of the orientation error is carried out by the optical detection means. Thus, the optical positional detection means can be used at the same time for several tasks. In the determination of the position of the axis of rotation, a single lens is sufficient for implementing the invention. In the determination of the orientation error, at least—in particular precisely—two lenses are advantageous, namely one above the substrate for determining the X-Y positions of the contact points on the top of the substrate, and the second below the substrate for determining the X-Y positions of the contact points on the bottom of the substrate.

By the determination of the orientation error being carried out in a first rotational position and a second rotational position of the substrate rotated relative to the first rotational position by an angle of rotation around the axis of rotation R, the determination of the orientation error is made possible in an especially simple and quick and thus advantageous way.

Other advantages, features and details of the invention will arise from the description below of preferred embodiments and based on the drawings.

BRIEF DESCRIPTION OF THE DRAWINGS

FIG. 1a shows a diagrammatic cross-sectional view of a substrate with correctly oriented contact points, FIG. 1b shows a diagrammatic cross-sectional view of a substrate with incorrectly oriented contact points, FIGS. 5a-5e show a diagrammatic representation of the method according to the invention according to FIGS. 4a-4e from an X-direction.

In the figures, the same components and components with the same function are identified with the same reference numbers.

DETAILED DESCRIPTION OF PREFERRED EMBODIMENTS

Figure 2A:
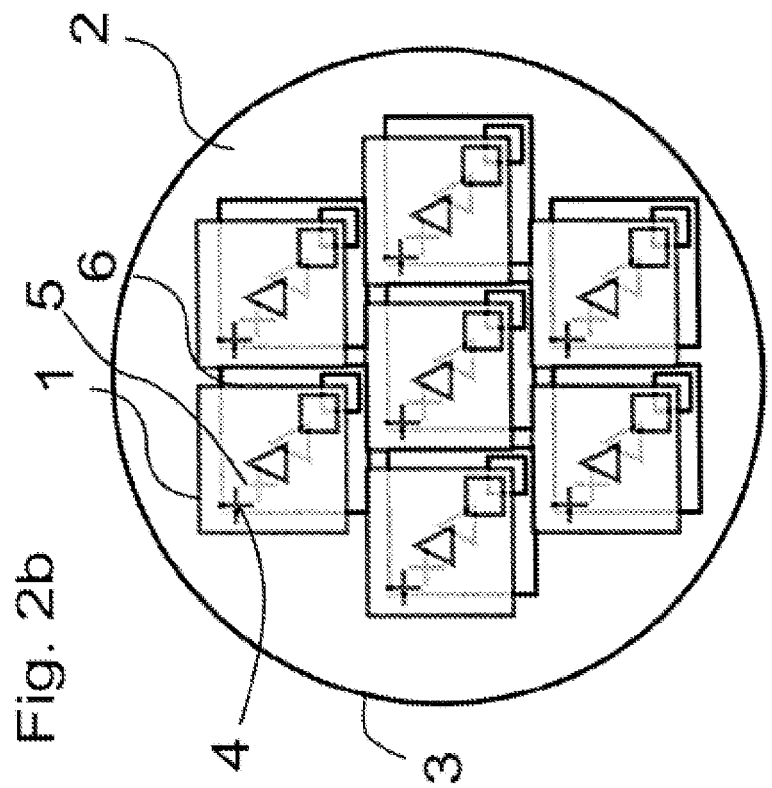
FIG. 2a shows a diagrammatic top view on a substrate according to FIG. 1a, FIG. 2b shows a diagrammatic top view on a substrate according to FIG. 1b.
Figure 2B:
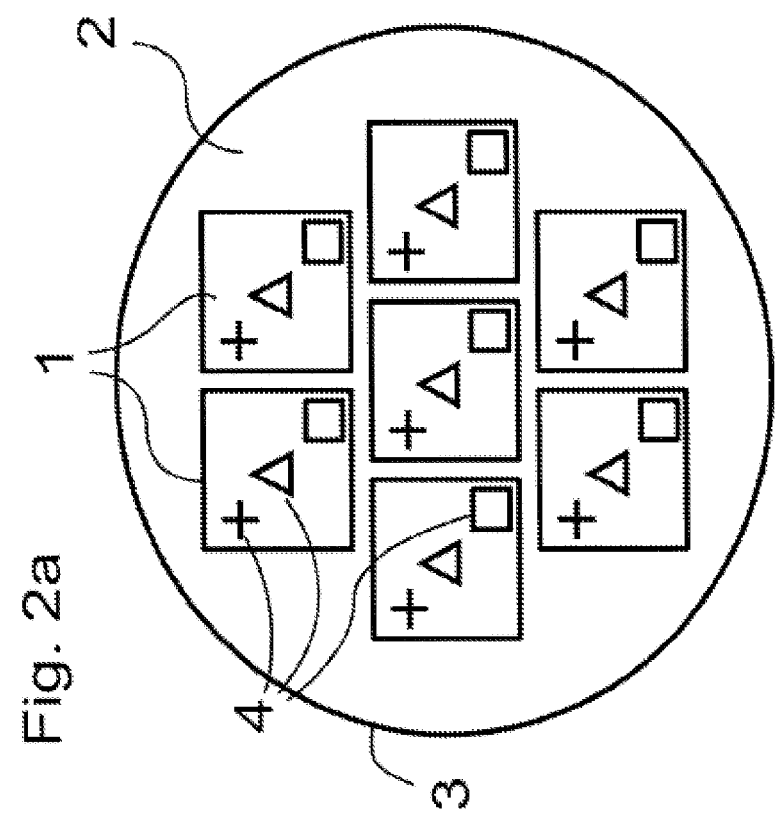

In FIGS. 1a and 1b, in each case a cross-section of a wafer 3 is shown as a substrate, which—as can also be seen in FIGS. 2a and 2b—has a large number of semiconductor components 1 on a top side 2 of the wafer 3 and a large number of semiconductor elements 6 on a bottom side 7 of the wafer 3.

Each semiconductor component 1, 6, designed here as dices 1, 6, has several contact points 4, 5, and the corresponding contact points 4 and 5 in each case are to be aligned exactly to one another, as shown in FIG. 1a and FIG. 2a. In FIGS. 1b and 2b, the contact points 4 and 5, and the dices 1 and 6 are not correctly oriented, so that such a wafer 3 is scrap or has to be outfitted again at least on one side.

In the figures, the dices and the contact points are shown greatly enlarged, and a wafer with a 300 mm diameter has several hundred dices 1, 6, that in each case have several contact points 4, 5, which are shown only diagrammatically here for the sake of clarity. Each dice 1, 6 has functional semiconductor components, whose contact points 4, 5 are symbolized diagrammatically by crosses, triangles, and rectangles in the drawings. The functional assemblies of the dices 1 on the top 2 do not have to match the functional components of the dices 6 on the bottom 7, but the contact points 4, 5 of the corresponding semiconductor components 1, 6 are identical.

If an error is discovered according to FIGS. 1b and 2b, and the deviation of the contact points 4, 5 is too large to achieve a sufficient vertical contact, the wafer 3 is removed from the production process and can be purified on the top 2 or the bottom 7 and treated lithographically again, after the error in the system has been determined.

Figure 3B:
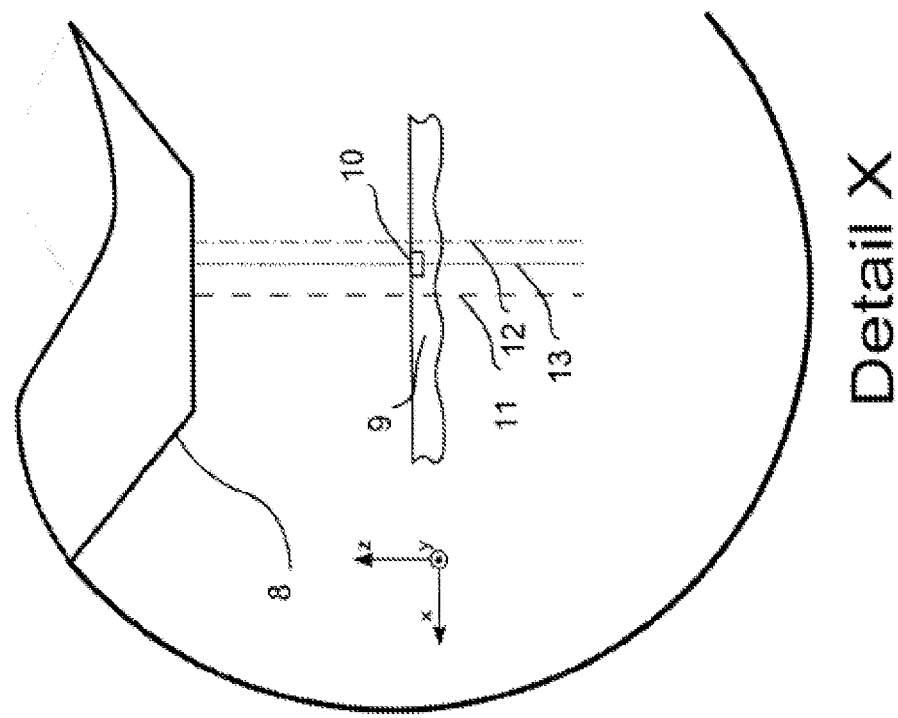
FIG. 3b shows a diagrammatic detail view of a detail according to FIG. 3a, FIGS. 4a-4e show a diagrammatic representation of the method according to the invention for determining the position of an axis of rotation from a Y direction.
Figure 3A:
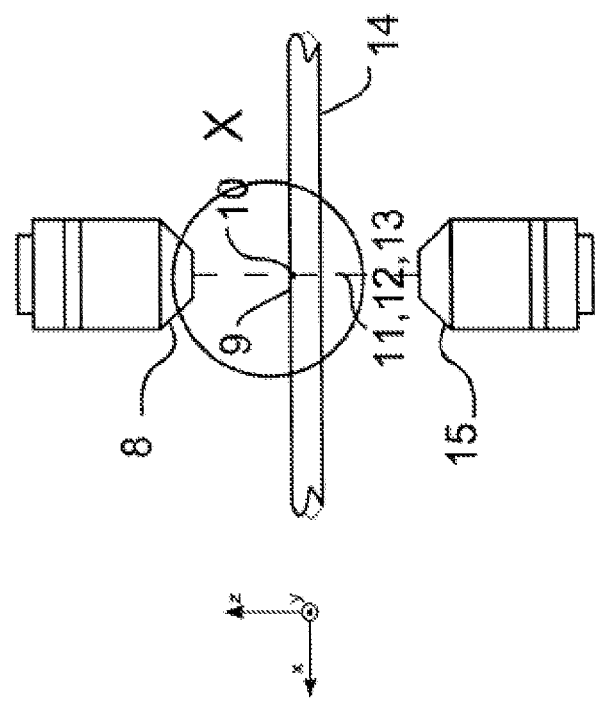
FIG. 3a shows a diagrammatic cross-sectional view of parts of a device for exerting a method according to the invention for determining the position of an axis of rotation.

In FIG. 3a and the detail view according to FIG. 3b, a substrate holding means 14 for holding the wafer 3 on a surface 9 of the substrate holding means 14 is shown. The holding means 14, which in the shape of a ring, allows both access to the top 2 of the wafer 3 and also to its bottom 7, as soon as the wafer 3 has been applied to the substrate holding means 14 and by its supporting the wafer 3 on its side edge. The wafer 3 can be fixed to the substrate holding means 14, and the substrate holding means 14 can be moved in a translatory manner in the X- and Y-directions specified by the arrows X and Y in the Cartesian X-Y coordinate system shown in FIG. 3a, in particular driven by linear motors with a precise control of the movement in the X- and Y-directions. At the same time, the substrate holding means 14 can rotate around an axis of rotation 12. The X-Y coordinate system is advantageously fixed relative to the lens 8. The axis of rotation 12 is perpendicular to the X- and Y-directions, i.e., in the Z-direction. The substrate holding means 14 thus has two degrees of freedom via a translation unit in the X- and Y-directions, i.e., in a substrate plane that coincides with the X-Y coordinate system. A rotation unit with one degree of freedom in the direction of rotation is found on the translation unit. The substrate holding means 14 is firmly connected to the latter after being fixed to the translation unit and the rotation unit, so that no error caused by changing the relative position of the substrate holding means 14 during the implementation of the method according to the invention can occur. The X-Y position of the axis of rotation 12 of the substrate holding means 14 is thus constant, inherent to the system, relative to the translation and rotation unit, just like a reference labeling 10 provided on the substrate holding means 14 and a wafer 3 fixed to the substrate holding means 14.

A first lens 8, whose optical axis 11 runs in Z-direction, i.e., parallel to the axis of rotation 12, is fixed above the substrate holding means 14. The lens 8 can be focused on the top 2 of the wafer 3 and/or the surface 9 of the substrate holding means 14 as well as on the top 2, and the lens 8 is able to detect, record and—as X-Y values—forward to a data processing system, not shown, structures on the top 2 and/or the surface 9. Since the position of the lens 8 and thus the optical axis 11 is fixed, the positions of optical labelings, in particular a reference labeling 10 of the substrate holding means 14, can be detected by means of the lens 8, preferably on its surface 9, and forwarded to a data processing system for evaluation.

In the embodiment shown in FIGS. 3a and 3b, a reference labeling 10 is applied to the surface 9 of the substrate holding means 14, a labeling whose position on the substrate holding means 14 is known at least approximately and that can accordingly be approached quickly by the translation unit to be detected by the lens 8.

Opposite to the lens 8, another lens 15 for detecting optical labelings or contact points 5 is arranged on the bottom 7 of the water 3 analogously to the lens 8, whereby an optical axis of the lens 15 is approximately aligned with the optical axis 11 of the lens 8. The second lens 15 is used at least primarily or exclusively to detect the X-Y position of the contact points 5 corresponding to the contact points 4 in the X-Y coordinate system or in the plane of the bottom 7 parallel thereto to be able to establish the orientation errors of the contact points 5, in particular the contact points 4, by the data processing system, in particular by vector analysis.

To determine or establish the X-Y position of the axis of rotation 12, first one side of the substrate holding means 14, the surface 9 below, is selected, and, according to FIG. 4a and FIG. 5a, the substrate holding means 14 is moved by the translation unit in the X- and Y-directions until the reference labeling 10 from an X-Y starting position 13 is in the optical axis 11 of the lens 8. The X-Y position of the reference labeling 10 at this point is stored in the data processing system as a first X-Y reference point RP. The substrate holding means 14 is then rotated by the rotation unit by an angle of rotation of 180 degrees into a second rotational position, namely by the axis of rotation 12, so that the reference labeling 10 is now arranged in a second X-Y reference position RP' relative to the previous first X-Y reference position RP according to FIG. 4c, exactly opposite the axis of rotation 12, i.e., in a mirror image to the axis of rotation 12. The figures FIGS. 4d and 5d then show that the distance of the axis of rotation 12 to the optical axis 11 in X- or Y-direction is half the distance between the old and new positions of the reference labeling 10 in the X- or Y-direction. Then, according to FIGS. 4e and 5e, the substrate holding means 14 can be moved by the translation unit in the X- and Y-directions so that the reference labeling 10 is again in the focus of the lens 8 and ultimately exactly in the optical axis 11. This step is not necessarily required in the calibration since the distance is already known from 4d and 5d; the "zero point" thus can already be set in the software. By establishing the X-Y position in the rotational position rotated by 180 degrees, the X-Y position of the axis of rotation 12 that is between the first and second X-Y reference position RP, RP' can be determined by the data processing system by means of vector analysis, for example by measuring the path in the X- and Y-directions covered by the translation unit during movement of the substrate holding means 14. The thus calculated value for the X-Y position of the axis of rotation 12 is then used at least for the period for determining the orientation error of the large number of contact points 4, 5 in the respective wafer 3 attached to the substrate holding means 14 as a reference value for the calculation of the orientation error. Only when applying/fixing a new wafer 3 to the substrate holding means 14 or only when using a new substrate holding means 14 must the determination of the X-Y position of the axis of rotation 12 be performed again in terms of a new calibration of the unit on the new substrate holding means 14.

Figure 6A:
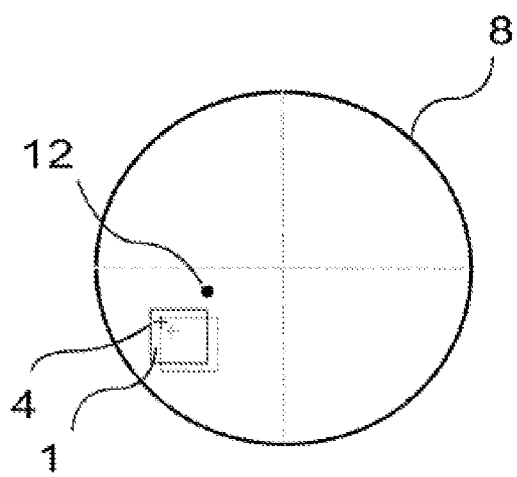
FIGS. 6a-6d show a diagrammatic representation of the method according to the invention for determining the orientation error in a top view.
Figure 6B:
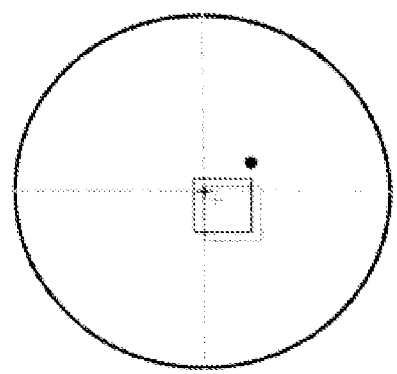
Figure 6C:
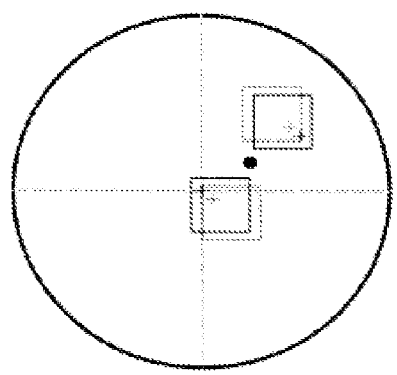
Figure 6D:
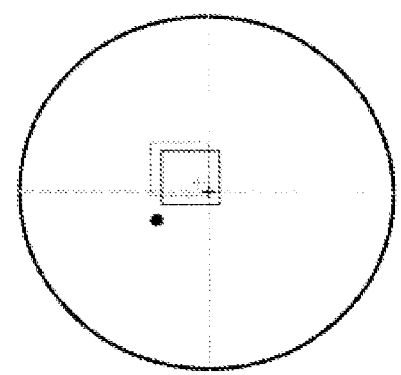

To determine or establish the orientation error of the contact point 4 to the contact point 5, shown in FIGS. 6a to 6d, first one side of the wafer 3, below the top side 2, is selected, and according to FIG. 4a and FIG. 5a, the wafer 3 is moved by the substrate holding means 14 until the contact point 4 is in the optical axis 11 of the lens 8 (FIG. 6b). Simultaneously or immediately, the position of the contact point 5 on the opposite side, thus the bottom 7, is then determined with the lower lens 15. The substrate holding means 14 is rotated by an angle of rotation of 180 degrees, namely by the axis of rotation 12, so that the contact points 4, 5 are now arranged exactly opposite the axis of rotation 12, i.e., in a mirror image to the axis of rotation 12, in a first rotational position according to FIG. 4d relative to the previous rotational position (FIG. 6c). Then, the wafer 3 is moved by the substrate holding means 14 so that the previously selected contact point 4 is again in the focus of the lens 8 (FIG. 6d). By the renewed establishment of the position of the opposite contact point 5 on the rotational position rotated by 180 degrees, the double orientation error can be determined by the data processing system, and after division by 2 of the corresponding orientation error between the contact points 4 and 5.

By the method according to the invention, the process for moving back the contact point 4 after the rotation of the substrate by 180 degrees in the focus of the lens 8 is greatly accelerated, since previously an exact positioning of the contact point 4 after the 180° rotation was possible only by a so-called pre-alignment because of the different configuration of the substrates and the deposition of the substrates on the substrate holding means. This means that after the rotation, the contact point 4 first had to be centered again in the image coordinate system of the lens 8 before the position of the corresponding contact point 5 could be measured on the opposite side of the top 7.

By the determination of the position of the axis of rotation 12, shown in FIGS. 3a to 5e, in the X-Y coordinate system in the substrate plane, fixed here relative to the lens 8, namely in the X- and Y-directions, the pre-alignment can be eliminated, since the exact X-Y position of the contact point 4 after the 180° rotation of the wafer 3 by the substrate holding means 14 is known and can be approached directly.

According to a special embodiment of the invention, it is conceivable, according to the invention, first to measure all contact points 4 and 5 distributed on the top 2 and bottom 7 in the first rotational position and then, after one-time rotation by 180 degrees, to measure in succession the positions of the contact points 4 and 5 in the second rotational position, since the respective positions of the corresponding contact points 4, 5 in the first rotational position are stored in a storage device within the analysis unit. This makes possible another significant acceleration of the method according to the invention.

An alternative means of establishing the position of the axis of rotation 12 proceeds as follows:

In FIG. 4a, instead of reference labeling 10, a contact point 4 arranged on the wafer 3, i.e., on the top 2 of wafer 3, is moved as a reference labeling from the position shown in FIG. 4a, i.e., outside of the axis of rotation 12 and outside of the optical axis 11 in X-direction (see FIG. 4b) and in Y-direction (see FIG. 5b) so far that the contact point 4 that is used as a reference labeling is exactly in the optical axis 11 of the lens 8.

The position of the contact point 4 is stored as X-Y reference position RP, namely as X-Y position in the X-Y coordinate system specified by the X- and the Y-direction.

Rotation of the substrate holding means 14 and thus of the wafer 3 fixed on the substrate holding means 14 with its contact point 4 that is used as a reference labeling by 180 degrees (see FIG. 4c). The rotation is carried out around the axis of rotation 12, so that the contact point 4 according to FIG. 4d and FIG. 5d is on the axis of rotation 12 in a mirror image to the first X-Y reference position RP in a second X-Y reference position RP'. The meaning of in a mirror image to the axis of rotation 12 is in a mirror image to the point of intersection of the axis of rotation 12 with the X-Y coordinate system or the substrate plane.

The substrate holding means 14 is moved so far according to FIGS. 4e and 5e by the translation unit or the translation drive in the X- and Y-directions until the reference labeling (contact point 4) is again in the optical axis 11. The movement of the substrate holding means 14 by the translation unit is measured/detected exactly and sent on to the data processing system so that from the first X-Y reference position RP and the second X-Y reference position RP', the exact X-Y position of the axis of rotation 12, namely in each case the half distance in the X- and Y-directions, is established, for example by vector analysis. The X-Y position that is established in this respect corresponds to the X-Y position of the axis of rotation 12 at the point of intersection with the substrate plane or the X-Y coordinate system.

The invention claimed is:

1. A method for determining an X-Y position of an axis of rotation of a substrate holding means, the substrate holding means being configured to hold a substrate, the X-Y position being on an X-Y coordinate system, the axis of rotation being perpendicular to the X-Y coordinate system, the substrate holding means being configured to rotate around the axis of rotation, the method, comprising the steps of:
    determining a first X-Y reference position RP of a reference labeling provided on the substrate holding means,
    rotating the substrate holding means by a defined angle of rotation R around the axis of rotation,
    determining a second X-Y reference position RP' of the reference labeling that is changed by the step of rotating,
    calculating the X-Y position of the axis of rotation in a plane of the substrate based on said first X-Y reference position RP and said second X-Y reference position RP', and
    determining an alignment error of contact points of the substrate,
    wherein the substrate is fixed on the substrate holding means during the step of determining the alignment error and the step of calculating.

2. A method according to claim 1, wherein the step of rotating is carried out by a rotation means of the substrate holding means.

3. A method according to claim 1, wherein the step of determining the first X-Y reference position RP and the step of determining the second X-Y position RP' are carried out by an optical positional detecting means with an optical axis that is parallel to the axis of rotation, the optical position determining means comprising at least one lens.

4. A method according to claim 3, wherein the substrate holding means is movable relative to the optical positional detecting means or parallel to the X-Y coordinate system, the movement being detectable in X and Y-directions in the X-Y coordinate system.

5. A method according to claim 1, wherein the step of determining is performed for one of the contact points located on one side of the substrate with respect to corresponding to one of the contact points located on an opposite side of the substrate.

* * * * *